United States Patent [19]
Hirono et al.

[11] 3,885,171
[45] May 20, 1975

[54] THYRISTOR ELEMENT AND CIRCUIT

[75] Inventors: Akira Hirono; Masayoshi Miyajima, both of Kyoto, Japan

[73] Assignee: Blackwell Electronics Ind. Co., Limited, Kyoto, Japan

[22] Filed: Nov. 3, 1971

[21] Appl. No.: 195,356

[30] Foreign Application Priority Data

Sept. 7, 1971 Japan ................................ 46-69390

[52] U.S. Cl. .......... 307/252 A; 307/252 N; 307/305; 307/313; 315/199

[51] Int. Cl. ............................................ H03k 17/72

[58] Field of Search ......... 307/252 A, 252 J, 252 N, 307/305, 313; 317/235 AB; 315/199

[56] References Cited

UNITED STATES PATENTS

| | | | |
|---|---|---|---|
| 3,121,802 | 2/1964 | Palmer | 307/288 |
| 3,206,696 | 9/1965 | Wright | 307/305 X |
| 3,466,529 | 9/1969 | Grafham | 307/305 X |
| 3,526,787 | 9/1970 | Stover | 307/288 X |
| 3,535,615 | 10/1970 | Howell et al. | 317/235 AB |

OTHER PUBLICATIONS

Electronics, Aug. 10, 1964 pp. 66–73 by R. A. Stasior "Helpful Transistor Analog: 4–layer pnpn ≈ 2 transistors".

*Primary Examiner*—John Zazworsky
*Attorney, Agent, or Firm*—Raphael Semmes

[57] ABSTRACT

The radio noise generated by a thyristor circuit is reduced by extending the turn-on time. A condenser is connected between the gate and cathode electrodes of the thyristor, which is so constructed that it has an equivalent circuit including a PNP transistor, an NPN transistor and three resistors, connected respectively between the base of the PNP transistor and the collector of the NPN transistor, the base of the NPN transistor and the collector of the PNP transistor, and the collector of the NPN transistor and the anode terminal of the thyristor. The time constant of the condenser with the equivalent resistors establishes the turn-on delay. An application of the invention in a lamp dimming circuit is disclosed.

4 Claims, 7 Drawing Figures

INVENTORS

AKIRA HIRONO

MASAYOSHI MIYAJIMA

Raphael Semmes ATTORNEY

THYRISTOR ELEMENT AND CIRCUIT

BACKGROUND OF THE INVENTION

This invention relates to the construction of a thyristor and a phase control circuit employing the thyristor with greatly reduced generation of radio noise.

Recently, a phase control system employing a semiconductor device such as a silicon controlled rectifier (hereinafter referred to as SCR) or thyristor has come into wide use for the speed control of motors including the motors of domestic electric appliances, for thermal control and light control. However, despite the fact that power control systems of this type using an SCR cause the development of radio noise in radio transmitting equipment, there has been no analysis of or action taken to cure this problem.

In general, we have discovered that because the turn-on time of the SCR is short, an abrupt or sharp building-up current flows through a distributing line as an electrical shock, thereby causing a high frequency wave to be generated across the power source impedance. This high frequency wave is considered to be induced directly into the input circuits of transmitting equipment or into the power source of the transmitting equipment through the power source device. To remove this radio noise, it has been a general practice to connect a high frequency choke to the filter of the power source so as to prevent the leakage of the noise wave to the distributing line. However, in view of the great electric power of the interference wave, the above practice has not been found to be satisfactory.

SUMMARY OF THE INVENTION

It is accordingly the principal object of the present invention to provide a thyristor or SCR power control circuit with greatly reduced generation of radio noise.

As a result of applicants' discovery that the generation of radio noise is due to the abrupt current build-up on turn-on of the thyristor or SCR, according to the present invention the generation of radio noise is reduced by extending the turn-on time of the thyristor or SCR. It is therefore a more specific object of the invention to provide a thyristor and thyristor circuit with an extended turn-on time.

Briefly, to this end, the present invention contemplates the provision of circuit means in the form of a condenser connected between the gate and cathode electrodes of the thyristor. The thyristor is specially constructed to have an equivalent circuit including a PNP transistor, an NPN transistor, and three resistors connected respectively between the base of the PNP transistor and the collector of the NPN transistor, the base of the NPN transistor and the collector of the PNP transistor, and the collector of the NPN transistor and the anode terminal of the thyristor. Upon the application of a trigger pulse to the gate electrode terminal of the thyristor, a positive feedback is operative on the equivalent transistors to cause turn-on of the thyristor. However, due to the time constant established by the condenser and the equivalent resistors of the thyristor, turn-on is delayed to extend the turn-on time and thus avoid the generation of radio noise.

In a particular application of the invention, the thyristor is connected in series with a load, such as a lighting load, and a source of alternating current power. A control circuit including a variable control resistor and a capacitor are connected across the thyristor, and a breakdown diode couples the junction between the control resistor and capacitor to the gate electrode of the thyristor. In accordance with the present invention, a condenser is connected between the gate and cathode terminals of the thyristor to extend the turn-on time.

The above and other objects, features, and advantages of the present invention will become more readily apparent from the following detailed description of a preferred embodiment of the invention with reference to the accompanying drawings.

DETAILED DESCRIPTION

Figure 1:
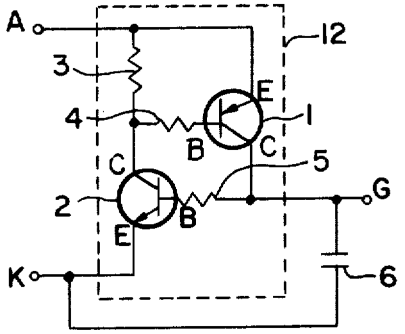
FIG. 1 is a circuit diagram of a thyristor circuit of the present invention, including the equivalent circuit of the thyristor of the present invention.

Referring now to FIG. 1 in which one example of the present invention is shown, a thyristor of SCR 12 is so constructed by known semi-conductor fabrication techniques such as localized diffusion of impurities to provide high resistivity regions, that it has the equivalent circuit enclosed with a dotted line. The construction thereof is such that the collector C of equivalent NPN transistor 2 is connected by way of an equivalent resistor 3 to the emitter E of equivalent PNP transistor 1, with said collector acting as the anode A of the subject SCR 12 and the emitter E of NPN transistor 2 acting as the cathode of the subject SCR 12. The collector C of this NPN transistor 2 is connected via equivalent resistor 4 to the base of PNP transistor 1, and the gate G of the subject SCR 12 is led out from the collector C of PNP transistor 1, with said collector being connected by way of an equivalent resistor 5 to the base B of NPN transistor 2. In addition, a condenser 6 is connected between the gate G of the subject SCR 12 and the cathode K.

Figure 2:
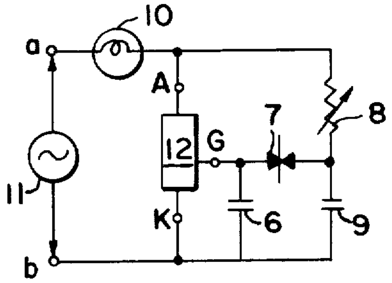
FIG. 2 is a circuit diagram of a light dimmer circuit employing the thyristor circuit of FIG. 1.

FIG. 2 shows one example of a dimming circuit according to the present invention, wherein a light source load 10 and SCR 12 are connected in series relation to alternating current power source 11. A variable resistor 8 and capacitor 9 are connected in series relation with each other and arranged in parallel relation with said SCR 12. A breakdown diode or DIAC 7 is interposed between the intermediate point of resistor 8 and capacitor 9 and the gate electrode G of SCR 12, and a condenser 6 is interposed between the gate G and cathode K.

In operation of the dimming circuit of the present invention, as shown in FIG. 2, when the power source 11 is poled positive at anode A, negative at cathode K, and positive at gate G, capacitor 9 will be charged through resistor 8 at a rate determined by the value of resistor 8. When the electric charge accumulated on capacitor 9 reaches the breakdown voltage of breakdown diode or DIAC 7, capacitor 9 is discharged through DIAC 7 to apply a trigger pulse to the gate-cathode circuit of SCR 12. A positive bias will be impressed through resistor 5 to the base B of transistor 2, and current will flow in the path from anode A of SCR 12 through resistor 3, collector C of NPN transistor 2, emitter E of transistor 2, and cathode K of SCR 12. The flow of current will develop a bias voltage at the base B of PNP transistor 1 which has been cut off to this time, the bias voltage being due to the voltage drop across resistor 3. This will result in a current flowing in the path from anode A of SCR 12 through emitter E of PNP transistor 1, collector C of transistor 1, resistor 5, base B of NPN transistor 2, emitter E of transistor 2 and cathode K of SCR 12. This means that a positive feedback is applied to NPN transistor 2 and PNP transistor base B because of the trigger pulse being introduced into the base B of NPN transistor 2, thereby causing current to flow between anode A and cathode K of SCR 12. When feedback is applied in this manner, a saturated region of the transistor characteristic is employed. The turn-on time of SCR 12 will be governed by a certain time constant established by condenser 6 and resistors 3, 4, and 5, which are connected between the gate G and cathode K of SCR 12. The resistance values of equivalent resistors 3, 4, and 5 and the capicitance value of condenser 6 are chosen to provide a time constant which will extend the turn-on time of thyristor 12 an amount sufficient to avoid abrupt build-up of current. Accordingly, the turn-on time will be greatly delayed. As a result, the high frequency noise at the power source together with radio noise become greatly diminished.

Figure 3A:
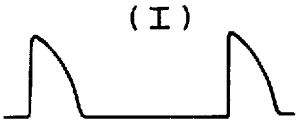
FIGS. 3A, 3B, 3C, and 3D are waveforms comparing the operation of the thyristor circuit of the present invention with the operation of thyristor circuits of the prior art.
Figure 3C:
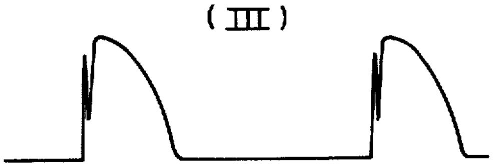
Figure 3B:
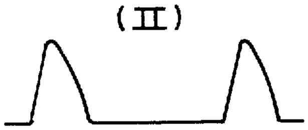
Figure 3D:
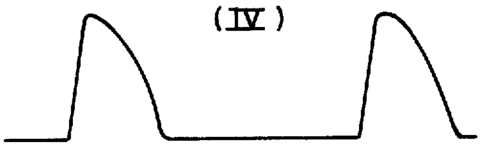
Figure 4:
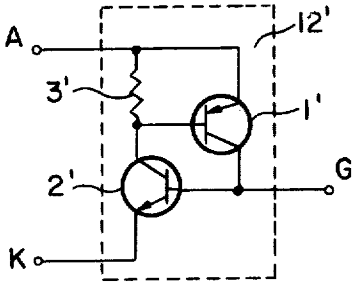
FIG. 4 is the equivalent circuit diagram of a conventional SCR.

FIGS. 3A, 3B, 3C, and 3D show this condition by using waveforms at the time of conduction and upon lamp loading. The waveforms represent the voltages across the opposite ends of the light source load of the dimming circuit. In the case when the conventional SCR as is shown in FIG. 4 is employed, the abruptly built-up waveform is obtained as shown in FIG. 3A. When the SCR and circuit of the present invention are used, dv/dt gives somewhat rounded waves as are shown in FIGS. 3B and 3D. Particularly when the impedance component on the distributing line is great, as shown in FIG. 3C, an abrupt pulse develops simultaneously with the onset of conduction; whereas, in the case of the device of the present invention, there is no pulse development as shown in FIG. 3D.

As is apparent from the foregoing, the present invention provides a phase control device employing a thyristor which generates very little radio noise by preventing the abrupt current flow to the distributing line.

We claim:

1. A semi-conductor circuit comprising: a thyristor having a gate electrode, an anode electrode, and a cathode electrode; and circuit means comprising a condenser connected between said gate electrode and said cathode electrode for preventing abrupt build-up of current flow through said thyristor and thereby reducing the generation of radio noise upon turn-on of said thyristor by extending the turn-on time of said thyristor, said thyristor being so constructed that it has an equivalent circuit including an NPN transistor and a PNP transistor, the collector of said NPN transistor being connected to the emitter of said PNP transistor through a first equivalent resistor, the collector of said NPN transistor being connected through a second equivalent resistor to the base electrode of said PNP transistor, the collector of said PNP transistor being connected to the base of said NPN transistor through a third equivalent resistor, said emitter of said PNP transistor serving as said anode electrode, said collector of said PNP transistor serving as said gate electrode, and said emitter of said NPN transistor serving as said cathode electrode, and said condenser and said first, second, and third equivalent resistors establishing a time constant which causes substantial delay in the turn-on time of said thyristor.

2. A semi-conductor circuit as recited in claim 1, further comprising a source of alternating current power, a load, said load being connected between one side of said source and said anode electrode, the other side of said source being connected to said cathode electrode, and a control circuit for said thyristor including a variable resistor and a capacitor connected in series between said anode and cathode electrodes and a breakdown element connected between the junction between said variable resistor and said capacitor and said gate electrode, whereby a trigger pulse is applied to said gate electrode when the charge on said capacitor reaches the breakdown voltage of said breakdown element.

3. A semi-conductor circuit as recited in claim 2, wherein said breakdown element comprises a DIAC.

4. A semi-conductor circuit as recited in claim 2, wherein said load is a lighting load and said circuit is a dimming circuit for said lighting load.

* * * * *